428-408. XR 3,577,325 SR

May 4, 1971 A. R. FAIRCHILD 3,577,325

METHOD OF RECLAIMING GRAPHITE MASK

Filed May 29, 1968 3 Sheets-Sheet 1

TX 3406

INVENTOR
A. R. FAIRCHILD
By D. W. Marks
ATTORNEY

May 4, 1971 A. R. FAIRCHILD 3,577,325

METHOD OF RECLAIMING GRAPHITE MASK

Filed May 29, 1968 3 Sheets-Sheet 2

May 4, 1971 A. R. FAIRCHILD 3,577,325

METHOD OF RECLAIMING GRAPHITE MASK

Filed May 29, 1968 3 Sheets-Sheet 3

United States Patent Office 3,577,325
Patented May 4, 1971

3,577,325

METHOD OF RECLAIMING GRAPHITE MASK

Albert R. Fairchild, Winston-Salem, N.C., assignor to Western Electric Company, Incorporated, New York, N.Y.

Filed May 29, 1968, Ser. No. 732,965
Int. Cl. C23b 1/00, 5/48
U.S. Cl. 204—24 2 Claims

ABSTRACT OF THE DISCLOSURE

A pallet and a mask for use in the manufacture of thin film components are machined from a block of high density fine grain pressed graphite to the desired size and shape. The graphite pallet and mask are plated with a flash of copper so that the copper may be dissolved or reacted with an acid to release the layer of precious metals which accumulate during repeated use of the pallet and mask. Thin film substrates are placed in the pallet and covered by the mask. In use, the assembled pallet and mask are inverted such that gravity forces the substrates against the mask to insure that the metal is deposited only on the desired areas of the substrate.

BACKGROUND OF THE INVENTION

(1) Field of the invention

In the manufacture of a thin film component, a metal conductor or circuit element is deposited on a selected area of a substrate. One method of making such a deposition is to cover the substrate with a mask leaving the selected area exposed. The masked substrate may then be positioned in a deposition chamber where metal is deposited on the exposed area of the substrate by high vacuum evaporation or sputtering.

(2) Description of the prior art

In the prior art, masks made from high density fine grain pressed graphite have several advantages. Since the coefficient of thermal expansion of graphite is very low, heat does not distort the graphite mask whereas masks made from metal expand or distort when exposed to heat during evaporating or sputtering deposition. Also, the low friction characteristics of graphite allow the masks to slide easily over metal surfaces whereas metal masks gall or stick to metal surfaces when in a high vacuum.

After a mask has been used several times, the metal or metals being deposited accumulate in many layers on the graphite. The prior art used various liquids or solutions to dissolve or react with, and remove, certain deposited metals or alloys. However, deposited precious metals, such as gold, require a solvent, such as aqua regia, which also attacks the pressed graphite. This results in the graphite mask becoming unuseable after several depositions.

In addition, the prior art masking facilities were not capable of handling large quantities of substrates reliably and economically. The mask must be accurately aligned with each substrate and effectively block the unexposed surfaces from the metal being deposited. The substrates vary slightly in dimensions due to slight inaccuracies which cannot be eliminated during their manufacture. For example, ceramic substrates made by molding a clay and binder and firing in a kiln will vary in size due to unavoidable inaccuracies in the molding of the raw substrates and to different shrinkages during firing of different batches of clay and binder. Prior art masking facilities could not handle large quantities of substrates and at the same time prevent the erroneous exposure of portions of the substrate due to slight variations in dimensions of the substrates.

SUMMARY OF THE INVENTION

An object of the present invention is a new and improved mask for covering a base or substrate in the manufacture of a thin film component.

Another object is a method of reclaiming a mask after it has been used.

A further object of the present invention is a new and improved pallet and mask arrangement for manufacturing large quantities of thin film components.

In accordance with these and other objects, a mask is machined from fine grain high density pressed graphite, in accordance with a desired pattern. The surfaces of the mask to be exposed to a depositing metal are plated with a metal which is easily removed, such as copper, so that after many uses the plated metal may be dissolved or reacted with an acid to recover the precious metal accumulated thereon.

Another feature of the invention is the utilization of a mask and pallet wherein a plurality of thin film substrates are loaded into the pallet to align them accurately in a desired array. The mask is then placed over the pallet and the pallet and mask inverted such that the mask then becomes the carrier and support for the substrates. Gravity forces the substrates against the mask to insure that only the desired areas of the substrates are exposed.

DETAILED DESCRIPTION

Figure 1:
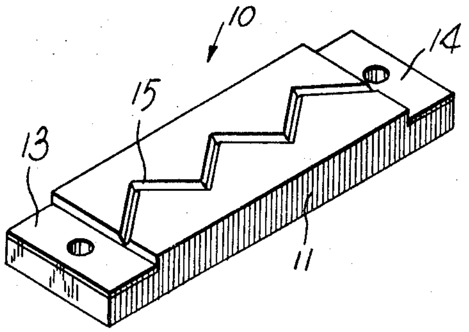
FIG. 1 is a plan view of a resistor substrate.

Referring to FIG. 1, there is shown a thin film resistor 10. The resistor 10 has a nonconductive substrate 11. A metallic resistive film, such as tantalum nitride is deposited on the entire upper surface of the substrate 11. Precious metal terminations 13 and 14 are then deposited onto the resistive film at each end of the substrate 11. The terminations may be the chromium-palladium-gold terminations described in application Serial No. 621,863, by P. M. Johnson, Jr., filed Mar. 9, 1967, and assigned to Western Electric Company, Inc. After the terminations 13 and 14 are formed, the raised center portion of the substrate 11 is abraded to leave the resistive film in the groove 15 having the desired value of resistance.

Figure 2:
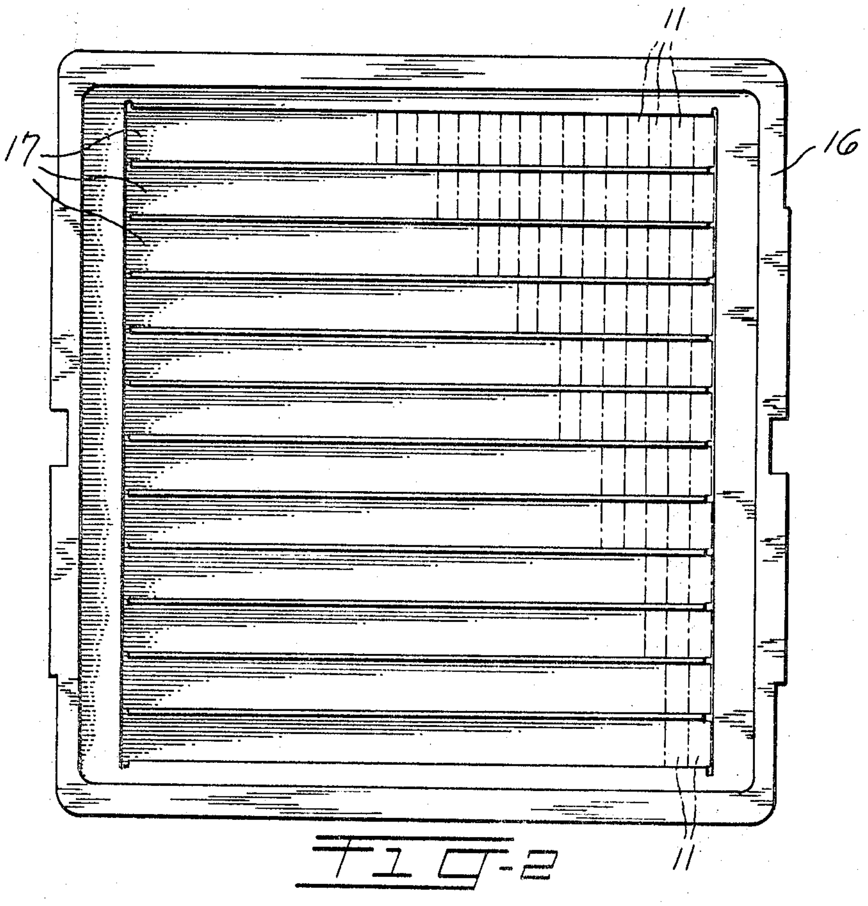
FIG. 2 is a plan view of a pallet for holding a plurality of the substrates shown in FIG. 1.
Figure 3:
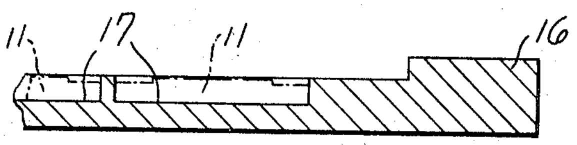
FIG. 3 is a partial cross-sectional side view of the pallet shown in FIG. 2.

Referring to FIGS. 2 and 3, there is shown a pallet 16 for receiving and aligning a plurality of substrates 11 upon which resistive films have been deposited. The pallets are made from a high density fine grain pressed graphite, such as that which is commercially available as P.G. graphite, grade EP 192, from Poco Graphite, Inc., of Garland, Tex. The pressed graphite is machined to form a plurality of parallel channels 17 for receiving the substrates 11 in side by side configuration as shown in FIG. 2. The substrates 11 are placed within the channels 17 and are held in a predetermined alignment in rows by the dimensions of the channels 17.

Figure 4:
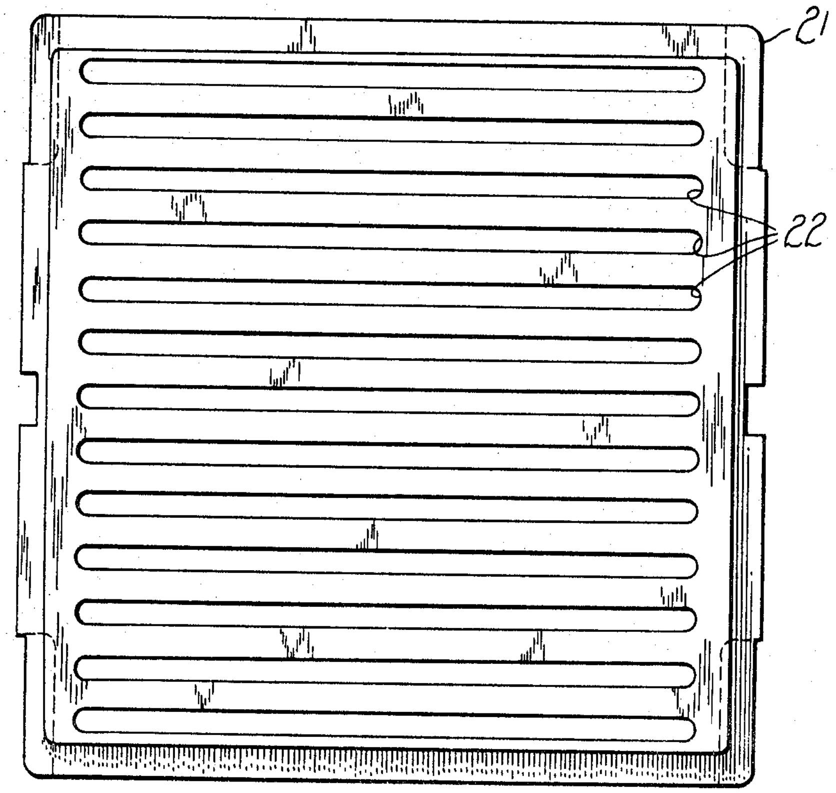
FIG. 4 is a plan view of a mask for mating with the pallet shown in FIG. 2.
Figure 5:
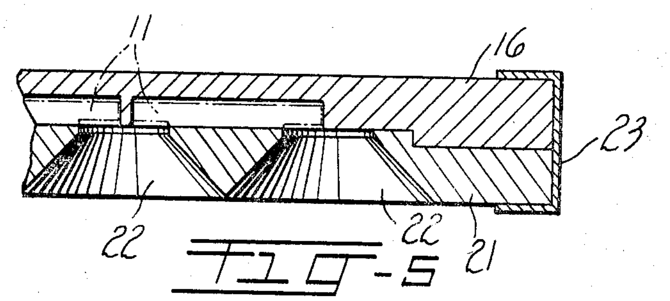
FIG. 5 is a partial cross-sectional side view of the mask shown in FIG. 4 and the pallet shown in FIGS. 4 and 5.

Referring now to FIGS. 4 and 5, there is shown a mask 21 which is designed to fit over the substrates 11 in the pallet 16 such that the end portions of the substrates 11 are exposed through beveled slots 22 which are parallel to the channels 17 of the pallet 16. The mask 21 is machined from pressed graphite which is the same graphite material used for the pallet 16. The pallet 16 and mask 21 are secured together by spring clips 23 placed over the edges of the pallet and mask. When the pallet 16 and mask 21 are inverted, as shown in FIG. 5, gravity forces the center portion of the substrates 11 tightly against the mask 21 to insure that only the end portions of the substrates 11 are exposed. This particular pallet and mask arrangement enables the handling of large quantities of substrates and at the same time insuring that deposition of metal is made only on the desired areas of the substrates.

Figures 6, 7:
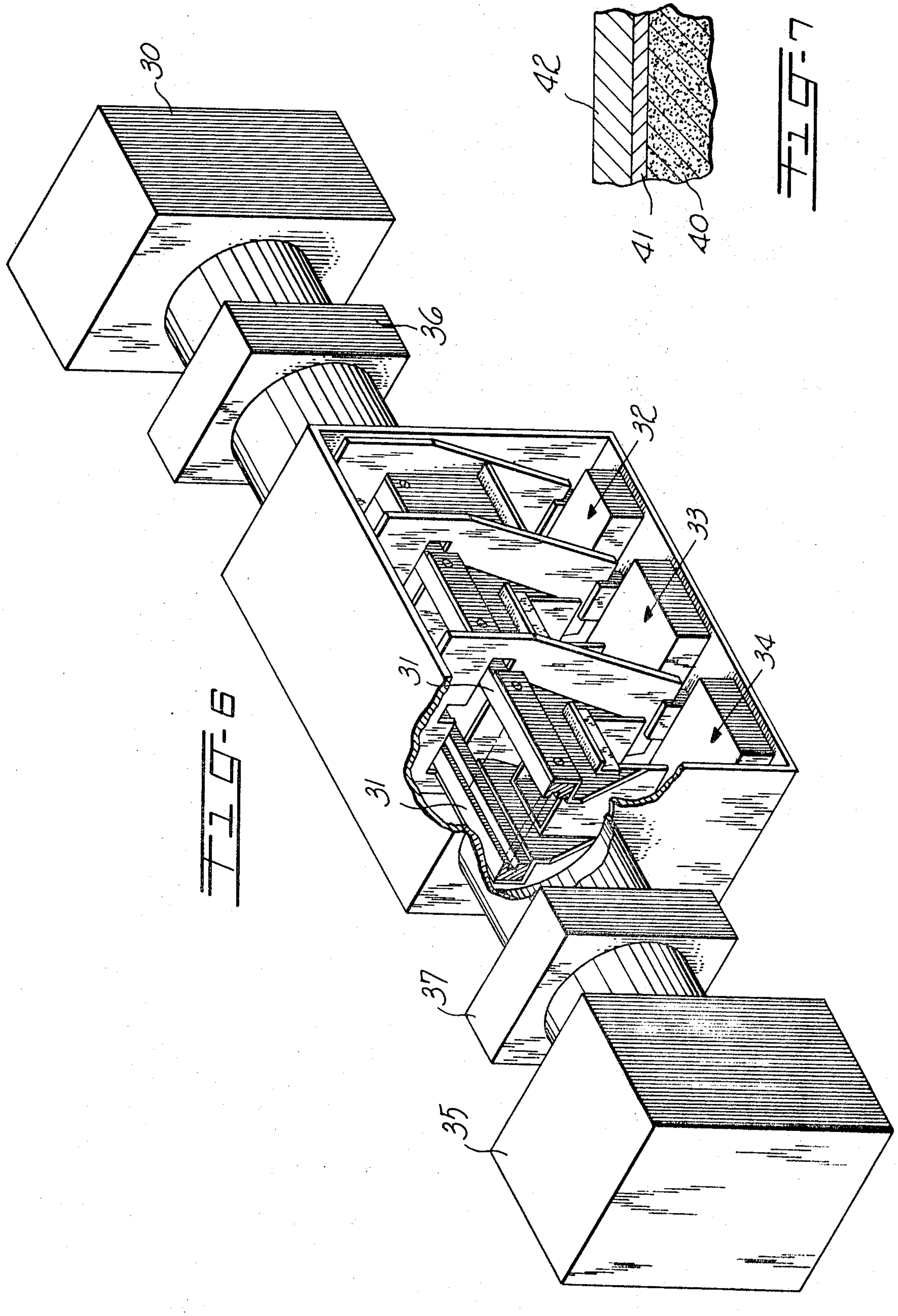
FIG. 6 is an isometric view of an apparatus utilizing the mask and pallets shown in FIGS. 2–5 for depositing metals on the substrates shown in FIG. 1.
FIG. 7 is an enlarged cross-sectional view of a portion of the mask and pallets shown in FIGS. 2–5 partially showing a layer of precious metal which has accumulated on a copper layer plated on a graphite base.

After the pallet 16 and the mask 21 have been formed from the pressed graphite material, the pallet 16 and the mask 21 are placed in an electrolytic bath of copper sulfate. Current is then passed through the graphite and electrolyte to plate a thin layer or flash of copper on the graphite. Referring to FIG. 7, the plated cross section shows the copper layer 41 plated on the graphite 40. The plated copper 41 may later be dissolved or reacted with and acid solution, such as dilute nitric acid, to free the precious metals 42 which accumulate during repeated use of the pallet and mask. The freed precious metals 42 are stripped from the pallet and mask and reclaimed by conventional processes. The stripped pallet and mask are then replated with a flash of copper to prepare them for reuse.

Referring now to FIG. 6, there is shown an evaporant apparatus for utilizing the pallet 16 and mask 21. The assembled pallets 16 and masks 21, containing substrates 11, are loaded into an enclosed chamber 30 which is isolated from the rest of the evaporating apparatus by valve 36. The chamber 30 is evacuated by a conventional arrangement of mechanical and diffusion vacuum pumps (not shown). After the chamber 30 is evacuated, the valve 36 may be opened. Suitable mechanism such as is described in application Ser. No. 733,553, filed on May 31, 1968, by C. S. Hammond, Jr., P. M. Johnson, Jr., J. C. Tribble and R. M. Tribble, and assigned to Western Electric Company, Inc., then sequentially advances the masks and pallets with the mask 21 facing downward along a pair of rails 31 over three evaporating chambers

32, 33 and 34, wherein the metals, chromium, palladium, and gold are successively evaporated on the exposed portions of the substrates 11 by conventional electron beam evaporators. The assembled pallets and masks are sequentially advanced into an unloading chamber 35 which is then isolated by a valve 37 to allow the assembled pallets and masks to be unloaded.

It is to be understood that the above-described embodiment is simply illustrative of the principles of the invention and that many other embodiments may be devised without departing from the scope and spirit of the invention.

What is claimed is:

1. A method of reclaiming a mask made of a graphite base with a thin coating of easily dissolvable metal upon which precious metal has been deposited by repeated use in a thin film deposition process; comprising the steps of:

immersing the mask in an acid solution which removes the easily dissolvable metal but does not dissolve or react with the graphite base or the precious metal;

stripping the freed precious metal from the mask, and recoating a thin layer of the easily dissolvable metal upon the graphite base.

2. A method of reclaiming a mask made of a graphite base with a thin coating of copper upon which precious metal has been deposited by repeated use in a thin film deposition process; comprising the steps of:

immersing the mask in a dilute solution of nitric acid until the copper coating has been dissolved.

stripping the freed precious metal from the mask; and replating a thin coating of copper on the graphite base.

References Cited

UNITED STATES PATENTS

| | | | |
|---|---|---|---|
| 2,057,272 | 10/1936 | Schumpelt | 75—101 |
| 3,302,612 | 2/1967 | Stutzman | 117—4 |

JOHN H. MACK, Primary Examiner

T. TUFARIELLO, Assistant Examiner

U.S. Cl. X.R.

75—117, 118, 121; 117—5.5, 6; 118—503, 504; 204—32, 279